(12) United States Patent
Wang et al.

(10) Patent No.: US 11,101,818 B2
(45) Date of Patent: Aug. 24, 2021

(54) METHOD AND DEVICE FOR STORING TIME SERIES DATA WITH ADAPTIVE LENGTH ENCODING

(71) Applicant: TSINGHUA UNIVERSITY, Beijing (CN)

(72) Inventors: Jianmin Wang, Beijing (CN); Xiangdong Huang, Beijing (CN); Jialin Qiao, Beijing (CN); Chen Wang, Beijing (CN); Mingsheng Long, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 16/769,913

(22) PCT Filed: Dec. 12, 2018

(86) PCT No.: PCT/CN2018/120596
§ 371 (c)(1),
(2) Date: Jun. 4, 2020

(87) PCT Pub. No.: WO2019/114753
PCT Pub. Date: Jun. 20, 2019

(65) Prior Publication Data
US 2020/0395954 A1 Dec. 17, 2020

(30) Foreign Application Priority Data
Dec. 12, 2017 (CN) .......................... 201711319331.1

(51) Int. Cl.
*H03M 7/40* (2006.01)
*H03M 7/30* (2006.01)

(52) U.S. Cl.
CPC ........... *H03M 7/40* (2013.01); *H03M 7/6011* (2013.01); *H03M 7/6058* (2013.01)

(58) Field of Classification Search
CPC ............ H03M 7/3064; H03M 7/3068; H03M 7/3095; H03M 7/40; H03M 7/6011; H03M 7/6058; H03M 7/3088; H03M 7/42
(Continued)

(56) References Cited

U.S. PATENT DOCUMENTS 3,717,851 A * 2/1973 Cocke ................. H03M 7/4025
711/220
5,907,638 A * 5/1999 Onodera ............. H03M 7/4031
382/239
(Continued)

FOREIGN PATENT DOCUMENTS

CN 102737132 A 10/2012
CN 103577456 A 2/2014
(Continued)

OTHER PUBLICATIONS

Wang, R., et al. Design and implementation of a real time parsing and storage system for massive meteorological data, Computer Engineering & Science, vol. 37, No. 11 (Nov. 2015).

*Primary Examiner* — Linh V Nguyen
(74) *Attorney, Agent, or Firm* — Stites & Harbison, PLLC; David W. Nagle, Jr.

(57) ABSTRACT

Provided are a method and device for storing time series data with adaptive length encoding, including: acquiring data values corresponding to timestamps according to a sequential order of timestamps; using a ratio of storage space values required to pre-store the previous n data values to storage space values required to pre-store rule information of a preset encoding rule and encoding data according to the previous n data values as a storage gain corresponding to the time at which the n-th data value is acquired; storing the rule information of the preset encoding rule and the encoding data corresponding to a previous n−1 data values when the
(Continued)

storage gain corresponding to the time at which the n-th data value is acquired is less than that corresponding to the time at which the (n−1)-th data value is acquired.

10 Claims, 2 Drawing Sheets

(58) Field of Classification Search
USPC .................................. 341/51, 67, 106, 107
See application file for complete search history.

(56) References Cited

U.S. PATENT DOCUMENTS

| | | | |
|---|---|---|---|
| 6,694,344 B1* | 2/2004 | Gerwig | G06F 11/085 |
| | | | 708/532 |
| 10,491,240 B1* | 11/2019 | Dupont | H03M 7/3046 |
| 10,536,163 B2* | 1/2020 | Marlow | G06F 21/602 |
| 2015/0288381 A1* | 10/2015 | Dickie | G06F 7/483 |
| | | | 708/203 |
| 2017/0017582 A1 | 1/2017 | Kang | |
| 2017/0192747 A1* | 7/2017 | Nakamura | G06F 5/00 |
| 2018/0191372 A1* | 7/2018 | Marlow | H03M 7/3093 |
| 2019/0349006 A1* | 11/2019 | Ma | H03M 13/1148 |

FOREIGN PATENT DOCUMENTS

| | | | |
|---|---|---|---|
| CN | 104753539 A | 7/2015 | |
| CN | 106126728 A | 11/2016 | |
| CN | 108052285 A | 5/2018 | |

\* cited by examiner

METHOD AND DEVICE FOR STORING TIME SERIES DATA WITH ADAPTIVE LENGTH ENCODING

CROSS-REFERENCE TO RELATED APPLICATION

Technical Field

This application is a national phase entry of International Application No. PCT/CN2018/12596 filed on Dec. 12, 2018, which is based on and claims priority to Chinese Patent Application No. 201711319331.1 filed on Dec. 12, 2017 entitled "Method and Device for Storing Time Series Data with Adaptive Length Encoding", which is incorporated herein by reference in its entirety.

BACKGROUND

Description of the Related Art

With the continuous development and maturity of technologies such as cloud computing, the Internet, and the Internet of Things, time series data occupies a large proportion in various fields and people's daily lives. The time series data is a series of data values with timestamps, arranged in ascending order of time and from the same target, such as ambient temperature, stock price, memory usage rate of a machine, and so on over a period of time. It usually has the characteristics of high production speed and large data amount.

In many practical application scenarios, the time series data is ultimately saved on a disk. Due to the large amount of data, one of the problems at present is how to efficiently store the time series data, so that the space of the disk can be occupied as small as possible. The basic idea to solve this problem is to encode the data and store the encoded data, that is, to convert the original data into another form by a specific algorithm. After this conversion, the required storage space is less than the original storage space. At present, a plurality of general methods have been proposed in the industrial and academic fields and have one thing in common, assuming that data will change according to certain rules. By storing these rules rather than the data itself, the storage space can be effectively reduced.

However, the storage of the encoded encoding data also gives rise to a series of problems, some abnormal data (for example, the abnormal data value at some time due to the failure of the collecting device) may be present in the actual time series data. In this case, the encoding of these abnormal data usually requires a large amount of descriptive information, which results in poor storage performance, and the optimal storage space saving effect is not achieved.

BRIEF SUMMARY

In order to overcome the problems above or at least partially solve the problems above, the present disclosure provides a method and device for storing time series data with adaptive length encoding.

According to an aspect of the present disclosure, a method for storing time series data with an adaptive length encoding includes: sequentially obtaining a data value corresponding to each timestamp according to a sequential order of timestamps in the time series data; encoding previous n data values according to a preset encoding rule, and acquiring a first encoding data corresponding to the previous n data values, wherein the first encoding data includes a first number of encoding values, wherein n is an integer greater than 1; determining a first storage space value required to pre-store the previous n data values, determining a second storage space value required to pre-store rule information of the preset encoding rule and the first encoding data, using a ratio of the first storage space value to the second storage space value as a storage gain at a first time, wherein the first time is the time at which n-th data value is acquired; storing the rule information of the preset encoding rule and a second encoding data corresponding to previous n−1 data values when the storage gain at the first time is less than that at a second time or the first number reaches a preset value, wherein the second time is the time at which (n−1)-th data value is acquired.

In an embodiment of the present disclosure, the encoding the previous n data values according to the preset encoding rule, and acquiring the first encoding data include: performing first-order differential processing on the previous n data values to acquire first-order differential values; determining a reference value, and sequentially acquiring a difference value between each first-order differential value and the reference value, wherein each difference value is taken as an encoding value.

In an embodiment of the present disclosure, the determining the reference value includes: using a minimum first-order differential value among all the first-order differential values as the reference value.

In an embodiment of the present disclosure, the determining the first storage space value required to pre-store the previous n data values include: determining a storage space value used to pre-store each data value; and using a product of the storage space value used to pre-store each data value and n as the first storage space value.

In an embodiment of the present disclosure, the determining the second storage space value required to pre-store rule information of the preset encoding rule and the first encoding data includes: determining storage space values required to pre-store the rule information; determining a storage space value required to pre-store each encoding value in the first encoding data and selecting a maximum value among all storage space values required to pre-store each encoding value in the first encoding data as a constant storage space value for pre-storing each encoding value in the first encoding data; using a product of the constant storage space value for pre-storing each encoding value in the first encoding data and the first number as storage space values required to pre-store the first encoding data, and using a sum of the storage space values required to pre-store the rule information and the storage space values required to pre-store the first encoding data as the second storage space value.

In an embodiment of the present disclosure, the storing the rule information of the preset encoding rule and the second encoding data corresponding to previous n−1 data values includes: using the constant storage space value for pre-storing each encoding value in the second encoding data as an actual storage space value; storing a number of encoding values in the second encoding data, a first data value, a minimum encoding value in the second encoding data and the actual storage space value as the rule information in a data table; and sequentially storing each encoding valued in the second encoding data in the data table according to allocated storage space, wherein each storage space value for allocating the occupation of the storage space is the actual storage space value.

In an embodiment of the present disclosure, after the storing the rule information of the preset encoding rule and the second encoding data corresponding to previous n−1 data values, the method further includes: storing n-th data value in a separate data table.

In another aspect of the present disclosure, a device for storing time series data with an adaptive length encoding includes: at least one processor; and at least one memory communicatively connected to the processor, wherein: the memory stores program instructions executable by the processor and the processor calls the program instructions to perform the methods described above.

In yet another aspect of the present disclosure, a computer program product is provided comprising: a computer program stored on a non-transitory computer readable storage medium, the computer program includes program instructions enabling a computer perform the methods described above when the program instructions are executed by the computer.

In still another aspect of the present disclosure, the present disclosure provides a non-transitory computer readable storage medium storing computer instructions that enable the computer to perform methods described above.

A method for storing time series data with an adaptive length encoding provided by the present disclosure includes: sequentially acquiring a data value corresponding to each timestamp according to a sequential order of timestamps in the time series data; encoding previous n data values according to a preset encoding rule, and acquiring a first encoding data corresponding to the previous n data values, wherein the first encoding data includes a first number of encoding values, wherein n is an integer greater than 1; determining a first storage space value required to pre-store the previous n data values, determining a second storage space value required to pre-store rule information of the preset encoding rule and the first encoding data, using a ratio of the first storage space value to the second storage space value as a storage gain at a first time, wherein the first time is the time at which n-th data value is acquired; storing the rule information of the preset encoding rule and a second encoding data corresponding to a previous n−1 data values when the storage gain at the first time is less than that at a second time or the first number reaches a preset value, wherein the second time is the time at which (n−1)-th data value is acquired. During the encoding of the sequence of the time series data, the storage gain is introduced to determine whether abnormal data exists in the sequence of the time series data, the encoding data corresponding to all the data ahead of the abnormal data is stored when it is determined that the abnormal data exists, thereby avoiding the adverse effect caused by the abnormal data in the encoding process, and ensuring the optimal storage space saving effect.

BRIEF DESCRIPTION OF THE DRAWINGS

In order to more clearly illustrate the technical solutions disclosed in the present disclosure or the prior art, the drawings used in the descriptions of the embodiments or the prior art will be briefly introduced below. Obviously, the drawings in the following description are only certain embodiments of the present disclosure, and other drawings can be obtained according to these drawings without any creative work for those skilled in the art.

DETAILED DESCRIPTION

In order to make the objectives, technical solutions and advantages of the present disclosure more clear, the technical solutions in the embodiments of the present disclosure are clearly and completely described in the following with reference to the accompanying drawings in the present disclosure. Obviously, the described embodiments are a part of the embodiments of the present disclosure, but not all of the embodiments. All other embodiments obtained by a person of ordinary skill in the art based on the embodiments of the present disclosure without any creative work belong to the scope of the present disclosure.

Figure 1:
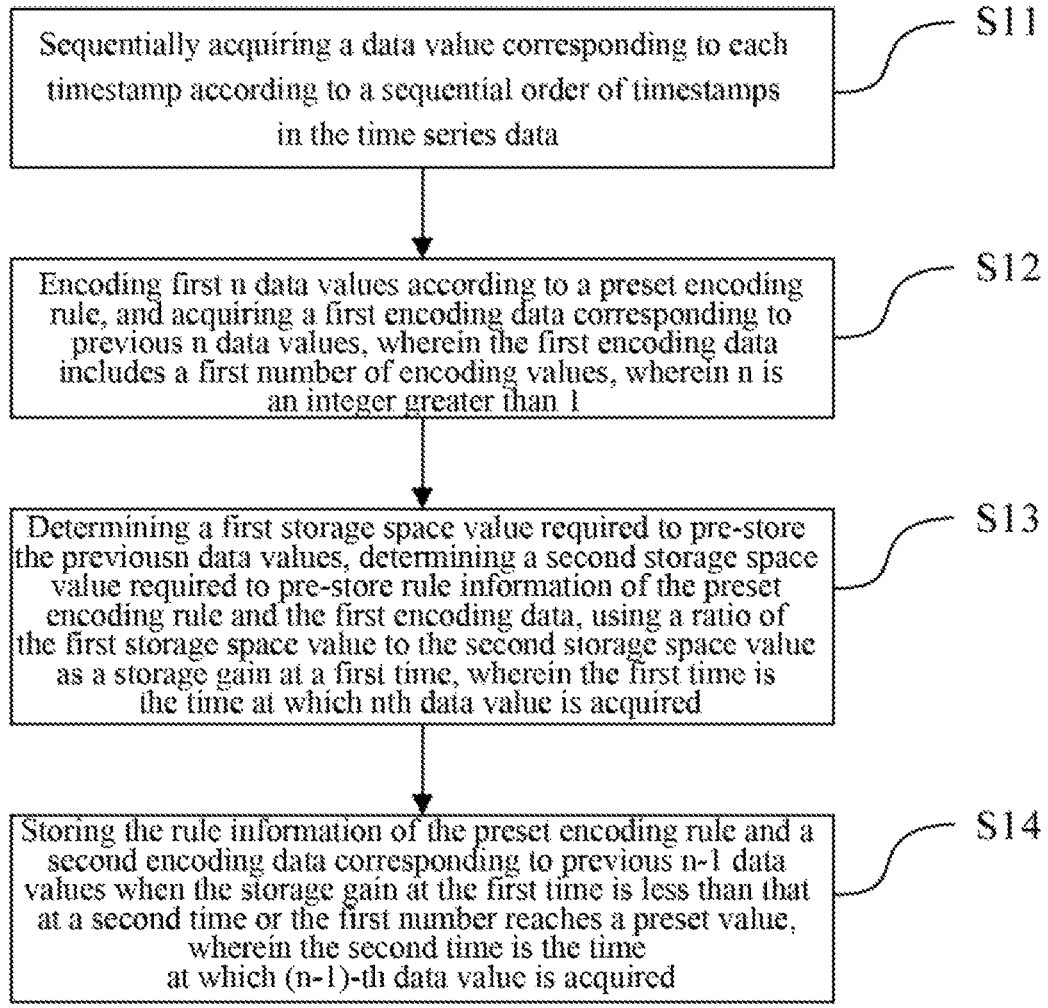
FIG. 1 is a flowchart of a method for storing time series data with adaptive length encoding in accordance with an embodiment of the present disclosure.

In an embodiment of the present disclosure, referring to FIG. 1, a method for storing time series data with an adaptive length encoding is provided, including: S11, sequentially acquiring a data value corresponding to each timestamp according to a sequential order of timestamps in the time series data; S12, encoding previous n data values according to a preset encoding rule, and acquiring a first encoding data corresponding to the previous n data values, wherein the first encoding data includes a first number of encoding values, wherein n is an integer greater than 1; S13, determining a first storage space value required to pre-store the previous n data values, determining a second storage space value required to pre-store rule information of the preset encoding rule and the first encoding data, using a ratio of the first storage space value to the second storage space value as a storage gain at a first time, wherein the first time is the time at which the n-th data value is acquired; S14, storing the rule information of the preset encoding rule and a second encoding data corresponding to previous n−1 data values when the storage gain at the first time is less than that at a second time or the first number reaches a preset value, wherein the second time is the time at which the (n−1)-th data value is acquired.

Specifically, the time series data is a series of data values with timestamps, arranged in ascending order of time and from the same target. For the time series data, a data value corresponding to each timestamp according to a sequential order of timestamps in the time series data is sequentially obtained when the time series data is stored, and n data values are encoded according to the preset encoding rule when the n data values have been acquired, so as to acquire encoding data. The storage gain is introduced in this embodiment and is a ratio of storage space values required to pre-store all data values to a total storage space value required to pre-store the encoding data and rule information of preset encoding rules; since encoding information of the preset encoding rule needs to be attached to facilitate decoding when the encoding data is stored, it is necessary to store the rule information of the corresponding encoding rule when the encoding data is stored and thus the required storage space value is the sum of the storage space values required to store the rule information of the preset encoding rule and the storage space values required to store the encoding data.

The storage gain corresponding to the time at which the n-th data value is acquired is compared with that corresponding to the time at which the (n−1)-th data value is acquired, it is illustrated that the n-th data value brings about a decrease in the storage gain and is likely to be an abnormal data value when the storage gain corresponding to the time at which the n-th data value is acquired is less than that corresponding to the time at which the (n−1)-th data value is acquired, and more information is needed to describe the abnormal data in the encoding process, resulting in the need for more storage space, so that the storage gain is reduced. Therefore, in the actual storage, it is necessary to exclude the influence of the storage gain drop caused by the n-th data value, and only the rule information of the preset encoding rule and encoding data corresponding to the previous n−1 data values are stored. In addition, the encoding data currently acquired by the rule information of the preset encoding rule may be stored in order to avoid data overflow, when the number of encoding values in the encoding data reaches a preset value.

According to the present embodiment, during the encoding of the sequence of the time series data, the storage gain is introduced to determine whether abnormal data exists in the sequence of the time series data, the encoding data corresponding to all the data ahead of the abnormal data is stored when it is determined that the abnormal data exists, thereby avoiding the effect of storage gain drop caused by the abnormal data in the encoding process, and ensuring the optimal storage space saving effect.

Based on the embodiments above, the encoding the previous n data values according to the preset encoding rule, and acquiring the first encoding data include: performing first-order differential processing on the previous n data values to acquire first-order differential values; determining a reference value, and sequentially acquiring a difference value between each first-order differential value and the reference value, wherein each difference value is taken as an encoding value.

In an embodiment of the present disclosure, the determining the reference value includes: using a minimum first-order differential value among all the first-order differential values as the reference value.

Specifically, for the previous n data values, first-order differential values between each data value and data values ahead of each data value are acquired in a first-order differential manner, and then a reference value is determined, each first-order differential value and the reference value are differenced to acquire a difference value as one encoding value; by selecting a minimum value in all the first-order differential values as the reference value, the differences between each first-order differential value and the reference value are non-negative numbers, that is, all encoding values are non-negative numbers; since the stored data needs to be converted into binary code, the encoding values are non-negative numbers, so that binary transcoding can be performed in the storage process.

Based on the embodiments above, the determining the first storage space value required to pre-store the previous n data values includes: determining a storage space value used to pre-store each data value; and using a product of the storage space value used to pre-store each data value and n as the first storage space value.

Specifically, when the time series data is stored, for the same sequence of data, each data is stored in the same storage space to facilitate reading, writing and managing, and the data value is stored without attaching any description information and thus storage space values required to pre-store the data values is a product of the storage space value used to pre-store each data value and the number (n) of the data values.

Based on the embodiments above, the determining the second storage space value required to pre-store rule information of the preset encoding rule and the first encoding data includes: determining storage space values required to pre-store the rule information; determining a storage space value required to pre-store each encoding value in the first encoding data and selecting a maximum value among all storage space values required to pre-store each encoding value in the first encoding data as a constant storage space value for pre-storing each encoding value in the first encoding data; using a product of the constant storage space value for pre-storing each encoding value in the first encoding data and the first number as storage space values required to pre-store the first encoding data, and using a sum of the storage space values required to pre-store the rule information and the storage space values required to pre-store the first encoding data as the second storage space value.

Specifically, since the data needs to be converted into a binary code as being stored, the size of the encoding values can determine its storage space values. For example, the binary code of the decimal value "10" is "1010", which requires 4 bits of storage space, and the binary code of a decimal value 2 is "10" which only requires 2 bits of storage space. The storage space occupied by each encoding value after being converted into binary code may not be the same. In order to completely store all encoding values without loss of information, a maximum value among the storage space values required to store each encoding value should be selected as an actual storage space value for storing each encoding value and a product of the actual storage space value and the number of the encoding values is used as the storage space value required to store the encoding data. Since encoding information of the preset encoding rule needs to be attached when the encoding data is stored, it is also necessary to calculate the storage space value required to store the encoding information of the preset encoding rule; therefore, when the storage gain is calculated, the influence of storage space values required to store the encoding information of the preset encoding rule needs to be considered, and the storage gain is calculated according to the sum of the storage space values required to store the encoding data and the storage space values required to store the rule information of the preset encoding rule.

Based on the embodiments above, the storing the rule information of the preset encoding rule and the second encoding data corresponding to previous n−1 data values includes: using the constant storage space value for pre-storing each encoding value in the second encoding data as the actual storage space value; storing the number of encoding values in the second encoding data, a first data value, a minimum encoding value in the second encoding data and the actual storage space value as the rule information in a data table; and sequentially storing each encoding valued in the second encoding data in the data table according to allocated storage space, wherein each storage space value for allocating the occupation of the storage space is the actual storage space value.

Figure 2:
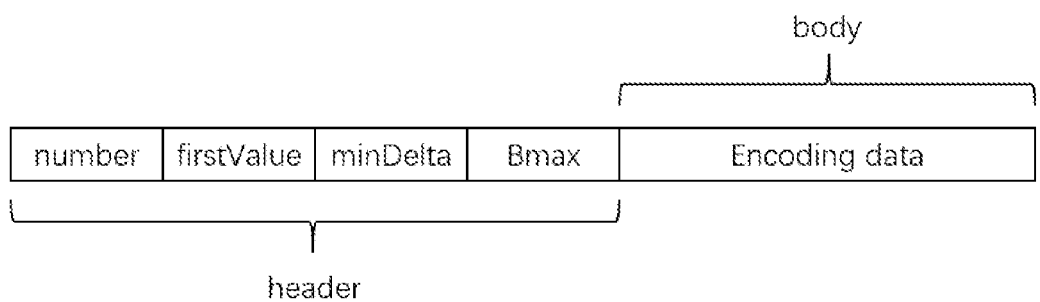
FIG. 2 is a schematic diagram of a data structure of a data table in accordance with an embodiment of the present disclosure.

Specifically, the rule information of the preset encoding rule and the encoding data corresponding to the previous n−1 data values are stored in a data table, and the data structure diagram of the data table is shown in FIG. 2. The data table includes a header and a body; the header is configured to store the rule information of the preset encoding rule, specifically including the number (number) of the encoding values stored in the data table, the first data value (firstValue), the minimum encoding value (minDelta) and the actual storage space value (Bmax) required to store each encoding value; the body is configured to store the encoding data (Encoding data), the storage spaces occupied by each encoding value are the same and the actual storage space values required to store each encoding values.

Based on the embodiments above, after the storing the rule information of the preset encoding rule and the second encoding data corresponding to previous n−1 data values, the method further includes: storing the n-th data value in a separate data table.

Specifically, since the storage gain is reduced, it is illustrated that the n-th data value is likely to be abnormal data, and this data value is stored in a separate data table, so as to avoid the influence of this data value on other data values in the term of storage space saving effect. Since there is only one data value, only "1, firstValue, 0, 0" are stored in the separate data table, wherein firstValue is the n-th data value, and since there is no encoding data, the body portion in the separate data table is empty.

As still another embodiment of the present disclosure, a device for storing time series data with an adaptive length encoding is provided, including: at least one processor; and at least one memory communicatively connected to the processor, wherein: the memory stores program instructions executable by the processor, the processor calls the program instructions to perform the methods provided in each of the method embodiments above, for example, including: sequentially acquiring a data value corresponding to each timestamp according to a sequential order of timestamps in the time series data; encoding previous n data values according to a preset encoding rule, and acquiring a first encoding data corresponding to the previous n data values, wherein the first encoding data includes a first number of encoding values, wherein n is an integer greater than 1; determining a first storage space value required to pre-store the previous n data values, determining a second storage space value required to pre-store rule information of the preset encoding rule and the first encoding data, using a ratio of the first storage space value to the second storage space value as a storage gain at a first time, wherein the first time is the time at which the n-th data value is acquired; storing the rule information of the preset encoding rule and a second encoding data corresponding to previous n−1 data values when the storage gain at the first time is less than that at a second time or the first number reaches a preset value, wherein the second time is the time at which the (n−1)-th data value is acquired.

As still another embodiment of the present disclosure, a computer program product is provided, including a computer program stored on a non-transitory computer readable storage medium, the computer program including program instructions. When the program instructions are executed by a computer, the computer is able to perform the methods provided by the foregoing method embodiments, for example, including: sequentially acquiring a data value corresponding to each timestamp according to a sequential order of timestamps in the time series data; encoding previous n data values according to a preset encoding rule, and acquiring a first encoding data corresponding to the previous n data values, wherein the first encoding data includes a first number of encoding values, wherein n is an integer greater than 1; determining a first storage space value required to pre-store the previous n data values, determining a second storage space value required to pre-store rule information of the preset encoding rule and the first encoding data, using a ratio of the first storage space value to the second storage space value as a storage gain at a first time, wherein the first time is the time at which the n-th data value is acquired; storing the rule information of the preset encoding rule and a second encoding data corresponding to previous n−1 data values when the storage gain at the first time is less than that at a second time or the first number reaches a preset value, wherein the second time is the time at which the (n−1)-th data value is acquired.

As yet still another embodiment of the present disclosure, a non-transitory computer readable storage medium is provided storing a computer program that causes a computer to perform the methods provided by the foregoing method embodiments, for example, including: sequentially acquiring a data value corresponding to each timestamp according to a sequential order of timestamps in the time series data; encoding previous n data values according to a preset encoding rule, and acquiring a first encoding data corresponding to the previous n data values, wherein the first encoding data includes a first number of encoding values, wherein n is an integer greater than 1; determining a first storage space value required to pre-store the previous n data values, determining a second storage space value required to pre-store rule information of the preset encoding rule and the first encoding data, using a ratio of the first storage space value to the second storage space value as a storage gain at a first time, wherein the first time is the time at which the n-th data value is acquired; storing the rule information of the preset encoding rule and a second encoding data corresponding to previous n−1 data values when the storage gain at the first time is less than that at a second time or the first number reaches a preset value, wherein the second time is the time at which the (n−1)-th data value is acquired.

It can be understood by a person skilled in the art that all or part of the steps of implementing the method embodiments above may be completed by using hardware related to computer program instructions. The foregoing computer program may be stored in a computer readable storage medium, and the program performs foregoing steps including the method embodiments above when being executed. The foregoing storage medium includes: a medium that can store program codes, such as a ROM, a RAM, a magnetic disk, or an optical disk.

Through the description of the embodiments above, those skilled in the art can clearly understand that the various embodiments can be implemented by means of software and a necessary general hardware platform, and of course, by hardware. Based on such understanding, the technical solutions of the present disclosure or a part of the technical solutions, which is essential or contributes to the prior art, may be embodied in the form of a software product, which is stored in a storage medium such as ROM/RAM, magnetic Discs, optical discs, etc., including several instructions to enable a computer device (which may be a personal computer, a server, or a network device, etc.) to perform the various embodiments or a part of the methods described in the various embodiments.

Finally, it should be noted that the above embodiments are only used to explain but not to limit the technical solutions of the present disclosure. Although the present disclosure is described in detail with reference to the foregoing embodiments, it should be understood by those skilled in the art that they can still modify the technical solutions described in the foregoing embodiments or make equivalent replacements to a part of the technical features, and these modifications or substitutions do not depart from the spirit and scope of the technical solutions of the embodiments of the present disclosure.

The invention claimed is:

1. A method for storing time series data with adaptive length encoding, comprising:

sequentially acquiring a data value corresponding to each timestamp according to a sequential order of timestamps in the time series data;

encoding previous n data values according to a preset encoding rule, and acquiring a first encoding data corresponding to the previous n data values, wherein the first encoding data comprises a first number of encoding values, wherein n is an integer greater than 1;

determining a first storage space value required to pre-store the previous n data values, determining a second storage space value required to pre-store rule information of the preset encoding rule and the first encoding data, using a ratio of the first storage space value to the second storage space value as a storage gain at a first time, wherein the first time is the time at which n-th data value is acquired;

corresponding to a previous n−1 data values when the storage gain at the first time is less than that at a second time or the first number reaches a preset value, wherein the second time is the time at which (n−1)-th data value is acquired.

2. The method of claim 1, wherein the encoding the previous n data values according to the preset encoding rule, and acquiring the first encoding data comprise:

performing first-order differential processing on the previous n data values to acquire first-order differential values; and determining a reference value, and sequentially acquiring a difference value between each first-order differential value and the reference value, wherein each difference value is taken as an encoding value.

3. The method of claim 2, wherein the determining the reference value comprises:

using a minimum first-order differential value among all the first-order differential values as the reference value.

4. The method of claim 1, wherein the determining the first storage space value required to pre-store the previous n data values comprises:

determining a storage space value used to pre-store each data value; and using a product of the storage space value used to pre-store each data value and n as the first storage space value.

5. The method of claim 1, wherein the determining the second storage space value required to pre-store rule information of the preset encoding rule and the first encoding data comprises:

determining storage space values required to pre-store the rule information;

determining a storage space value required to pre-store each encoding value in the first encoding data, and selecting a maximum value among all storage space values required to pre-store each encoding value in the first encoding data as a constant storage space value for pre-storing each encoding value in the first encoding data; and using a product of the constant storage space value for pre-storing each encoding value in the first encoding data and the first number as storage space values required to pre-store the first encoding data, and using a sum of the storage space values required to pre-store the rule information and the storage space values required to pre-store the first encoding data as the second storage space value.

6. The method of claim 1, wherein the storing the rule information of the preset encoding rule and the second encoding data corresponding to previous n−1 data values comprises:

using the constant storage space value for pre-storing each encoding value in the second encoding data as an actual storage space value;

storing a number of encoding values in the second encoding data, a first data value, a minimum encoding value in the second encoding data and the actual storage space value as the rule information in a data table; and sequentially storing each encoding valued in the second encoding data in the data table according to allocated storage space, wherein each storage space value for allocating the occupation of the storage space is the actual storage space value.

7. The method of claim 1, wherein after the storing the rule information of the preset encoding rule and the second encoding data corresponding to previous n−1 data values, the method further comprises:

storing n-th data value in a separate data table.

8. A device for storing time series data with adaptive length encoding, comprising:

at least one processor; and at least one memory communicatively connected to the processor, wherein:

the memory stores program instructions executable by the processor, the processor calls the program instructions to perform the method of claim 1.

9. A computer program product, comprising: a computer program stored on a non-transitory computer readable storage medium, the computer program comprising program instructions enabling a computer to perform the method of claim 1, when the program instructions are executed by the computer.

10. A non-transitory computer readable storage medium storing computer programs that enable a computer to perform the method of claim 1.

* * * * *